United States Patent
Kang et al.

(10) Patent No.: US 8,286,886 B2
(45) Date of Patent: Oct. 16, 2012

(54) LED PACKAGE AND RFID SYSTEM INCLUDING THE SAME

(75) Inventors: Hee Bok Kang, Cheongju (KR); Ji Mook Kim, Cheongju (KR)

(73) Assignee: Hynix Semiconductor Inc., Icheon-Si (KR)

( * ) Notice: Subject to any disclaimer, the term of this patent is extended or adjusted under 35 U.S.C. 154(b) by 221 days.

(21) Appl. No.: 12/818,969

(22) Filed: Jun. 18, 2010

(65) Prior Publication Data

US 2011/0147466 A1 Jun. 23, 2011

(30) Foreign Application Priority Data

Dec. 23, 2009 (KR) .......... 10-2009-0129394
Dec. 23, 2009 (KR) .......... 10-2009-0129399

(51) Int. Cl.
*G06K 19/06* (2006.01)
(52) U.S. Cl. .......... 235/492; 235/375; 235/451
(58) Field of Classification Search .......... 235/492, 235/375, 451; 257/79, 99
See application file for complete search history.

(56) References Cited

U.S. PATENT DOCUMENTS

| | | | |
|---|---|---|---|
| 2002/0050518 A1* | 5/2002 | Roustaei | 235/454 |
| 2005/0161682 A1* | 7/2005 | Mazzochette et al. | 257/79 |
| 2005/0274959 A1 | 12/2005 | Kim et al. | |
| 2007/0126018 A1* | 6/2007 | Kosowsky | 257/98 |
| 2009/0303008 A1 | 12/2009 | Kang | |
| 2010/0103678 A1* | 4/2010 | Van De Ven et al. | 362/294 |

FOREIGN PATENT DOCUMENTS

| | | |
|---|---|---|
| JP | 2003-123040 A | 4/2003 |
| KR | 1020050035638 A | 4/2005 |
| KR | 1020050055589 A | 6/2005 |
| KR | 100892324 B1 | 1/2009 |

* cited by examiner

*Primary Examiner* — Edwyn Labaze

(57) ABSTRACT

The LED package comprising a substrate and a display device, stacked on the substrate, including a light emitting diode (LED), and so on. A light emitting diode (LED) package comprises a LED device configured to emit light, an electrostatic discharge (ESD) device including an ESD circuit formed under the LED device, a printed circuit board (PCB), including a power supply line, formed under the ESD device, and a heat sink substrate, formed under the PCB, configured to release a heat delivered from the LED device through the ESD device and PCB.

43 Claims, 10 Drawing Sheets

LED PACKAGE AND RFID SYSTEM INCLUDING THE SAME

CROSS-REFERENCES TO RELATED APPLICATIONS

This application is based upon and claims the benefit of priority to Korean Patent Applications Nos. 10-2009-0129394 and 10-2009-0129399, respectively filed on Dec. 23, 2009, the entire contents of which are incorporated herein by reference.

BACKGROUND OF THE INVENTION

Embodiments of the present invention relates to a light emitting diode (LED) package and a RFID system; and particularly, to a RFID tag configured to communicate with an external reader by transmitting and receiving a wireless signal to control an LED package.

A Radio Frequency Identification (RFID) is a type of communication method which provides contactless identification by using a RFID chip attached to a target for identification and a RFID reader configured to transmit a wireless signal with the RFID chip. The RFID can make improvements on conventional optical character recognition technology as well as advance a conventional automatic identification system such as a bar code system.

Recently, a RFID system may be used in a distribution system (logistics), an access authentication system, an electronic payment system, an access card system used in transportations and securities, and so on.

For example, for logistics an integrated circuit (IC) chip including identification information can be used for inventory control and classification instead of a delivery sheet, slip or chip. In the access authentication system, entry to an office or a system is determined by an IC card including personal information.

An RFID device stores data within a memory, particularly the RFID chip may comprise a nonvolatile ferroelectric memory configured to store information.

The data processing speed of nonvolatile ferroelectric memory (i.e., Ferroelectric Random Access Memory (FeRAM)) is typically similar to that of Dynamic Random Access Memory (DRAM). However, FeRAM is different than DRAM, in that data stored in FeRAM is retained even when power to the memory device is turned off. Thus, FeRAM has been receiving a lot of attention and is considered a strong candidate as a next generation memory device.

The structure of FeRAM is similar to that of DRAM in that FeRAM includes a plurality of capacitors. However, the capacitors in a FeRAM device are made of a ferroelectric material having a high residual polarization, which in turn allows for data retention even when the power supplied to the memory device is terminated.

FIG. 1 is a block diagram describing a conventional RFID system. As shown, the conventional RFID system includes an antenna unit 1, an analog processing unit 10, a digital processing unit 20, and an information storing unit 30.

Herein, the antenna unit 1 is for receiving a wireless signal transmitted from an external RFID reader. The wireless signal received through the antenna unit 1 is passed through antenna pads 11 and 12 and inputted to the analog processing unit 10.

The analog processing unit 10 amplifies the wireless signal to generate a power voltage VDD used as a power source for the RFID chip, and extracts a command signal from the wireless signal to output the command signal into the digital processing unit 20. Also, the analog processing unit 10 outputs a power-on-reset signal POR (for controlling a reset operation in response to the power voltage VDD) and a clock signal CLK to the digital processing unit 20.

The digital processing unit 20 receives the power voltage VDD, the power-on-reset signal POR, the clock signal CLK, and the command signal CMD, and generates a response signal RP that is provided to the analog processing unit 10. Additionally, the digital processing unit 20 provides an address ADD, an input/output data I/O, a control signal CTR, and the clock signal CLK to the information storing unit 30.

The information storing unit 30 reads or writes the input/output data I/O at a location corresponding to the address ADD and retains the data even after the power is turned off.

The RFID system operates in various frequency-bands, but operating capabilities of the RFID system can be changed according to a different frequency-band. As the RFID system operates in a lower frequency-band, a recognition speed becomes slower and an operation range becomes smaller, but a recognition rate is less influenced by external environments. Otherwise, if the RFID system operates in a higher frequency-band, a recognition speed becomes faster and an operation range becomes broader, but a recognition rate is more influenced by external environments.

SUMMARY OF THE INVENTION

An embodiment of the present invention is to provide a LED package comprising a substrate and a display device, stacked on the substrate, including a light emitting diode (LED), and so on.

An embodiment of the present invention is to provide a package comprising a substrate using a through silicon via (TSV) having a high thermal conductivity so that efficiency of outputting relative luminous flux and efficiency of heat release generated by a display device attached to the substrate are improved.

An embodiment of the present invention is to provide a system comprising a LED package coupled to a RFID chip configured to remotely control a display device included in the LED package.

An embodiment of the present invention is to provide a system comprising a LED package including a temperature sensor, which is configured to control amount of current supplied into a LED device according to sensed temperature.

According to an embodiment of the present invention, a light emitting diode (LED) package comprises a LED device configured to emit light, an electrostatic discharge (ESD) device including an ESD circuit formed under the LED device, a printed circuit board (PCB), including a power supply line, formed under the ESD device, and a heat sink substrate, formed under the PCB, configured to release a heat delivered from the LED device through the ESD device and PCB.

According to an embodiment of the present invention, a radio frequency identification (RFID) system comprises a plurality of LED packages including a LED device, a RFID chip configured to read or write information in response to a wireless signal received through an antenna, and an operation controller configured to control operation of the plurality of LED packages in response to a control signal inputted from the RFID chip.

According to an embodiment of the present invention, a LED package comprises a LED device configured to emit light, an ESD device including an ESD circuit formed under the LED device, a PCB, including a power supply line, formed under the ESD device, a heat sink substrate, formed under the PCB, configured to release a heat delivered from the LED device through the ESD device and PCB, and a temperature sensor configured to sense temperature around the LED device.

According to an embodiment of the present invention, a RFID system comprises a plurality of LED packages, including a LED device, configured to output a temperature detection signal sensed by a temperature sensor, a RFID chip configured to read or write information in response to a wireless signal received through an antenna and output a control signal for controlling amount of current supplied to the plurality of LED packages in response to the temperature detection signal, and an operation controller configured to control operation of the plurality of LED packages in response to the control signal.

DESCRIPTION OF EMBODIMENTS

Hereinafter, specific embodiments of the present invention will be described with reference to the accompanying drawings. The drawings are not necessarily to scale and in some instances, proportions may have been exaggerated in order to more clearly depict certain features of the invention.

Figure 1:
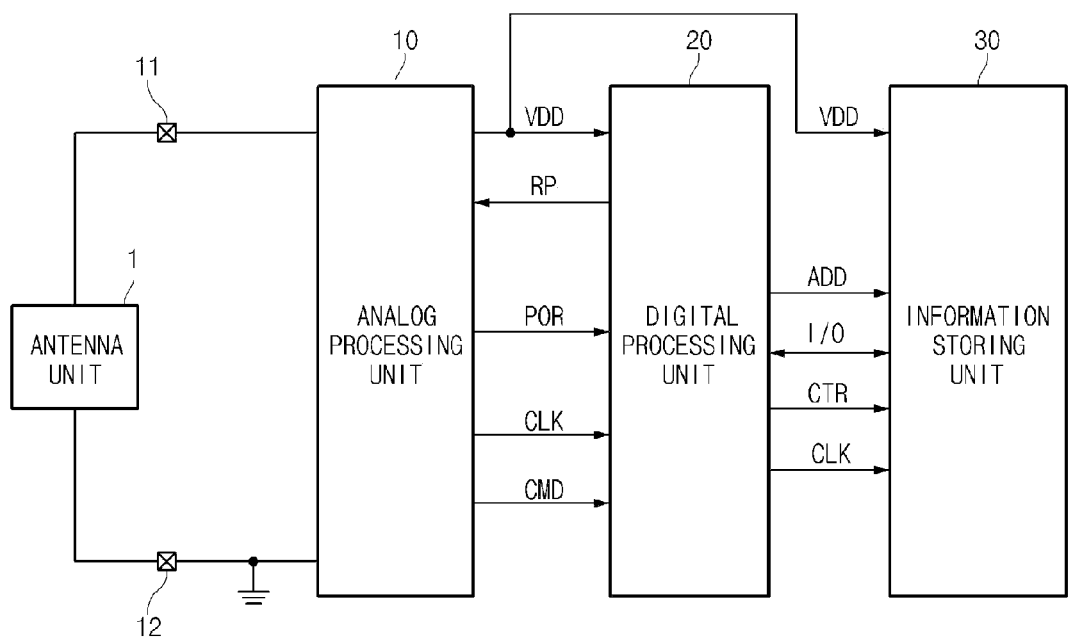
FIG. 1 is a block diagram describing a conventional RFID system.
Figure 2:
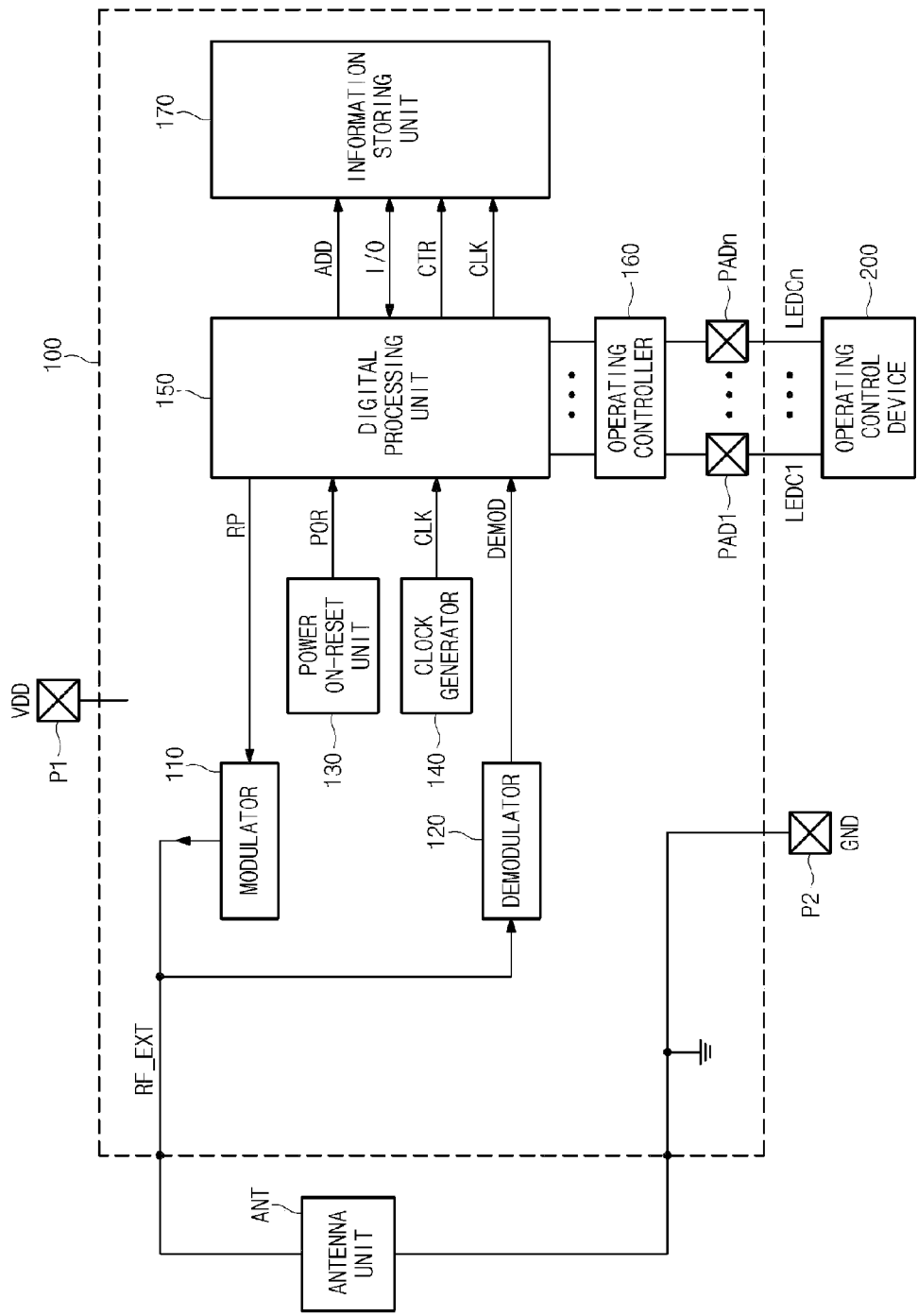
FIG. 2 is a block diagram showing a RFID chip according to an embodiment of the present invention.

FIG. 2 is a block diagram showing a radio frequency identification (RFID) chip 100 in a RFID package according to an embodiment of the present invention. As shown, the RFID chip 100 includes an antenna unit ANT, a modulator 110, a demodulator 120, a power-on-reset unit 130, a clock generator 140, a digital processing unit 150, an operating controller 160, an information storing unit 170, and a plurality of pads PAD1 to PADn. Herein, the plurality of pads PAD1 to PADn is coupled to an external operation control device 200.

The antenna unit ANT receives a wireless signal RF_EXT transmitted from a RFID reader. The antenna unit ANT outputs the wireless signal RF_EXT into the RFID chip 100 to the demodulator 120 through an antenna pad (not shown).

Further, the antenna unit ANT transmits a wireless signal received from the RFID chip 100 to an external RFID reader. A wireless signal delivered from the modulator 110 to the antenna unit ANT is transmitted to the external RFID reader through the antenna pad (not shown).

The demodulator 120 demodulates the wireless signal RF_EXT inputted through the antenna ANT to generate a command signal DEMOD and output the command signal DEMOD to the digital processing unit 150. The modulator 110 modulates a response signal RP inputted from the digital processing unit 150 to transmit a modulated signal to the antenna ANT.

The power-on-reset 130 senses the power voltage VDD inputted from a power voltage pad P1 and outputs a power-on-reset signal POR to the digital processing unit 150.

Herein, the power-on-reset signal POR for controlling a reset operation of internal circuits in the RFID chip 100 rises along with a transition from a low level to a high level of the power voltage VDD The power-on-reset signal POR then changes from a high level to a low level after a predetermined time when the power voltage VDD is maintained at the high level to thereby reset an internal circuit of the RFID chip 100.

The clock generator 140 outputs a clock signal CLK to the digital processing unit 150. The clock signal CLK is for controlling an operation of the digital processing unit 150 according to the power voltage VDD delivered through the power voltage pad P1.

In the present embodiment, the RFID chip 100 is operated by a power voltage VDD and a ground voltage GND supplied through pads P1 and P2, respectively. In the conventional method when a RFID tag communicating with a RFID reader receives a wireless signal, the RFID tag can be supplied with a power voltage by an internal voltage amplifier.

However, in the present embodiment, because the RFID chip 100 is coupled to the external operation control device 200 which could then be coupled to many LED lights, a lot more power is needed. Thus, the present embodiment provides the power voltage VDD and the ground voltage GND to the RFID chip 100 via the pads P1 and P2.

Receiving the power voltage VDD, the power-on-reset signal POR, the clock signal CLK and the command signal DEMOD, the digital processing unit 150 decodes the command signal DEMOD to generate a control signal CTR and a plurality of process signals. Also, the digital processing unit 150 outputs the response signal RP corresponding to the control signal CTR and the plurality of process signals to the modulator 110. The digital processing unit 150 outputs an address ADD, an input/output data I/O, the control signal CTR, and the clock signal CLK to the information storing unit 170.

The operating controller 160 is located between the digital processing unit 150 and the plurality of pads PAD1 to PADn. According to an instruction signal inputted from the digital processing unit 150, the operating controller 160 outputs control signals for controlling operation of the external operation control device 200. The external operation control device 200 is coupled to the operating controller 160 of the RFID chip 100 via the plurality of pads PAD1 to PADn.

Herein, the plurality of pads PAD1 to PADn is coupled to the external operation control device 200 via connection pins, which serve as a connection block configured to couple the RFID chip 100 and the external operation control device 200. The control signals LEDC1 to LEDCn delivered via the plurality of pads PAD1 to PADn are outputted to the external operation control device 200.

The external operation control device includes a controller configured to control operations of display devices such as a LED, a motor, a speaker, and so on.

The information storing unit 170 includes a plurality of memory cells, each being able to store inputted data and output stored data.

The information storing unit 170 may include a nonvolatile ferroelectric memory. The data processing speed of Ferroelectric Random Access Memory (FeRAM) is typically similar to that of Dynamic Random Access Memory (DRAM). Further, the structure of FeRAM is similar to that of DRAM in that FeRAM includes a plurality of capacitors. However, the capacitors in a FeRAM device are made of a ferroelectric material having a high residual polarization, which in turn allows for data retention even when the power supplied to the memory device is terminated.

Figure 3:
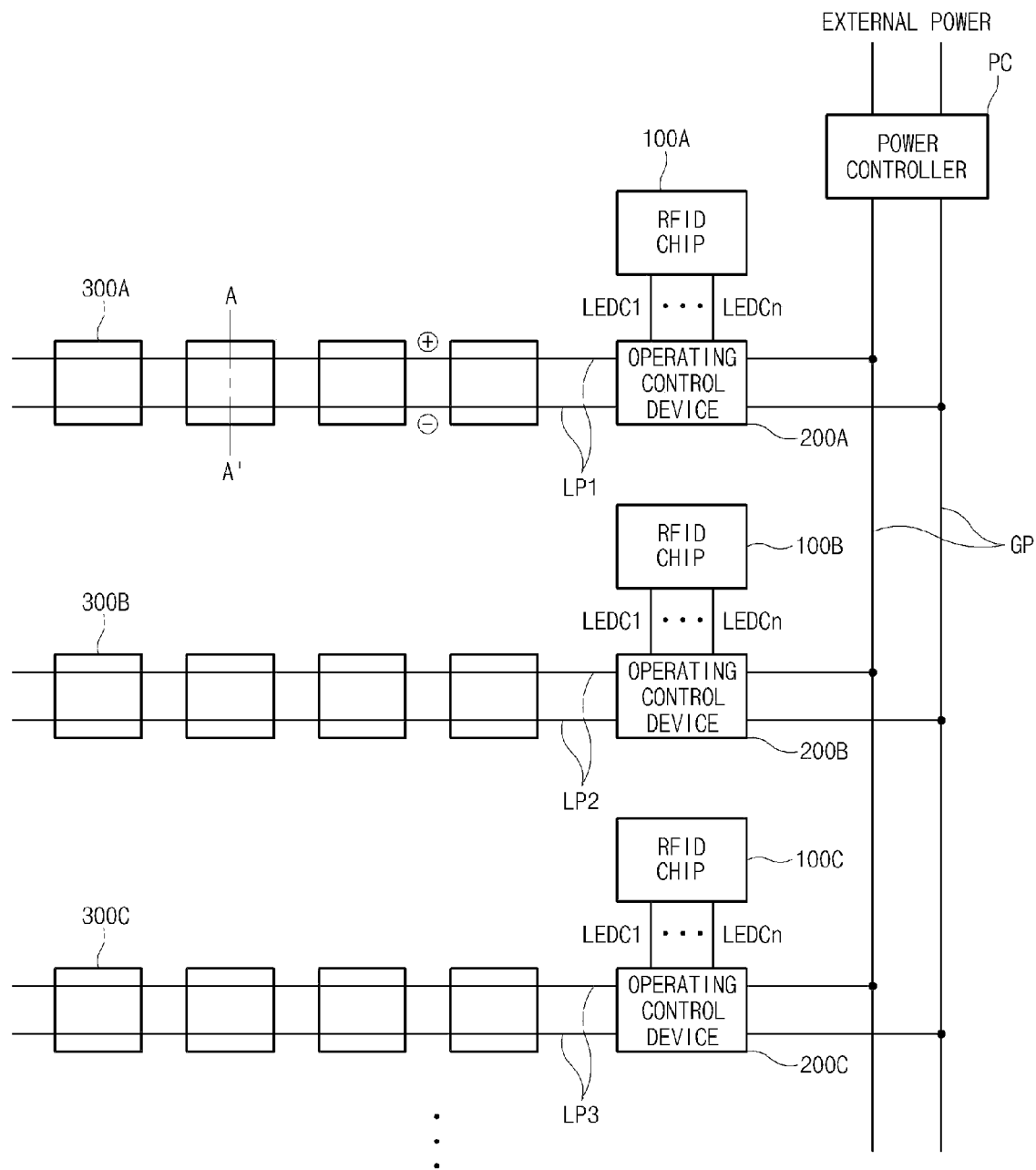
FIG. 3 is a block diagram showing a RFID system including a LED package according to an embodiment of the present invention.

FIG. 3 is a block diagram showing a RFID system including the RFID chip 100 shown in FIG. 2. As shown, the RFID system includes RFID chips 100A to 100C, operation control devices 200A to 200C, LED packages 300A to 300C, and a power controller PC. As used herein, the term "the RFID system" refers to an apparatus including all of the RFID chips 100A to 100C, the operation control devices 200A to 200C, the LED packages 300A to 300C, and the power controller PC.

The RFID chip 100A to 100C coupled to the operation control devices 200A to 200C outputs control signals LEDC1 to LEDCn to the operation control devices 200A to 200C. Herein, the operation control devices 200A to 200C deliver the control signals LEDC1 to LEDCn inputted from the RFID chip 100A to 100C into the LED package 300A to 300C. The operation control devices 200A to 200C can include switching devices (not shown).

The operation control devices 200A to 200C selectively supply power to the LED packages 300A to 300C through local power lines LP1 to LP3. Herein, the operation control devices 200A to 200C are controlled by the control signals LEDC1 to LEDCn inputted from the RFID chips 100A to 100C.

In addition, a plurality of LED packages 300A to 300C are controlled by the local power supplied through the local power lines LP1 to LP3. The LED packages 300A to 300C each coupled to the local power lines LP1 to LP3 are arranged in rows.

Further, the power controller PC is coupled to a global power line GP and supplies an external power to the global power line GP. The operation control devices 200A to 200C receive power from the power controller PC via the global power line GP. Herein, the voltage of the global power line GP is determined by the power controller PC.

Figure 4:
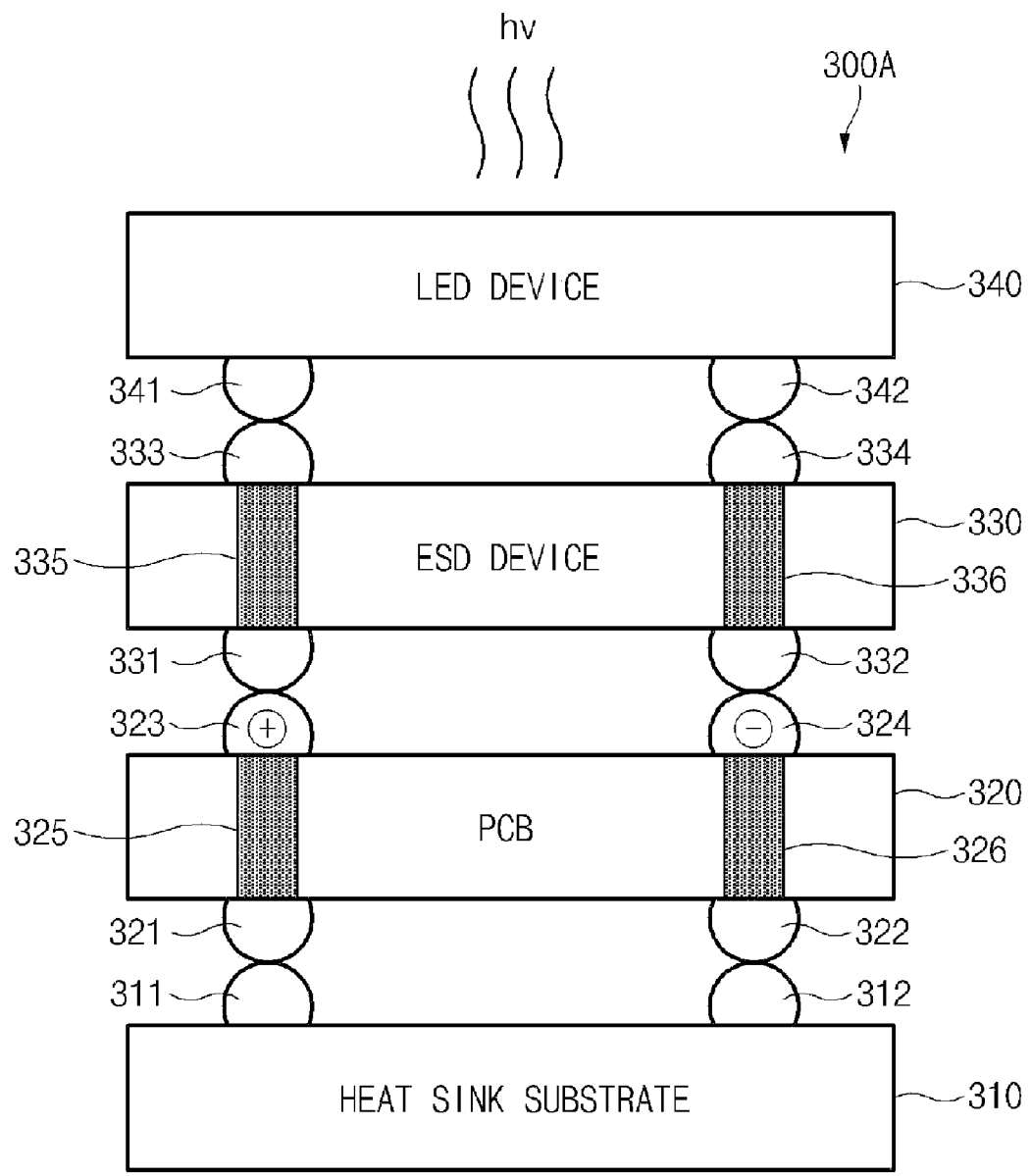
FIG. 4 is a block diagram depicting a cross section of the LED package shown in FIG. 3

FIG. 4 is a block diagram showing the LED package 300A shown in FIG. 3. Particularly, FIG. 4 depicts a cross section of the LED package 300 along cut plane A-A' shown in FIG. 3

The LED package 300A includes a heat sink substrate 310, a printed circuit board (PCB) 320, an electrostatic discharge (ESD) device 330, and a LED device 340.

Herein, the heat sink substrate 310, the printed circuit board 320, the ESD device 330, and the LED device 340 are coupled to each other.

Heat sink electrodes 311 and 312 are formed in a shape of a bump (or a partial spherical shape) over the heat sink substrate 310. Lower electrodes 321 and 322 are formed in a shape of a bump under the PCB 320. Herein, the lower electrodes 321 and 322 of the PCB 320 are electronically coupled to the heat sink electrodes 311 and 312 of the heat sink substrate 310. Over the PCB 320, upper electrodes 323 and 324 are formed in a shape of a bump.

Under the ESD device 330, lower electrodes 331 and 332 are formed in a shape of a bump. The lower electrodes 331 and 332 are electronically coupled to the upper electrodes 323 and 324. Over the ESD device 330, upper electrodes 333 and 334 are formed in the shape of a bump.

Further, LED electrodes 341 and 342 are formed in a shape of a bump under the LED device 340. The LED electrodes 341 and 342 are electronically coupled to the upper electrodes 333 and 334.

In addition, the PCB 320 includes a power supply line and Through-Silicon Vias (TSVs) 325 and 326. The TSV 325 passes through the PCB 320. The upper electrode 323 is electronically coupled to the lower electrode 321 by the TSV 325. Likewise, the TSV 326 passes through the PCB 320. The upper electrode 324 is electronically coupled to the lower electrode 322 by the TSV 326.

The ESD device 330 includes an electrostatic discharge circuit and Through-Silicon Vias (TSVs) 335 and 336. The TSV 335 passes through the ESD device 330. The upper electrode 333 is electronically coupled to the lower electrode 331 by the TSV 335. Likewise, the TSV 336 passes through the ESD device 330. The upper electrode 334 is electronically coupled to the lower electrode 332 by the TSV 336.

The heat sink substrate 310, the PCB 320, the ESD device 330, and the LED device 340 are coupled to each other, and each are electronically connected through the TSVs 335, 336, 325, and 326.

In the LED package 300A having a structure described above, if power is supplied through the local power line LP1, the LED device 340 emits light hv. Herein, power terminals of the LED device 340 are coupled to the LED electrodes 341 and 342 which are conductive electrodes.

When the LED device 340 emits light, the LED device 340 generates a lot of heat. This heat is conducted to the heat sink substrate 310 through the TSVs 335, 336, 325, and 326.

The TSVs 335 and 336 include a material having a characteristic of high thermal conductivity to rapidly transfer the heat generated by the LED device 340 into the heat sink substrate 310. Further, the TSVs 335 and 336 include a conductive material for supplying a current to the LED device 340.

In addition, the heat sink substrate 310 includes a heat sink substrate fan configured to remove the heat delivered from the LED device 340. The heat sink substrate 310 includes a material having a characteristic of high thermal conductivity in order to transfer heat generated by the LED device 340 into the surrounding air.

Figure 5:
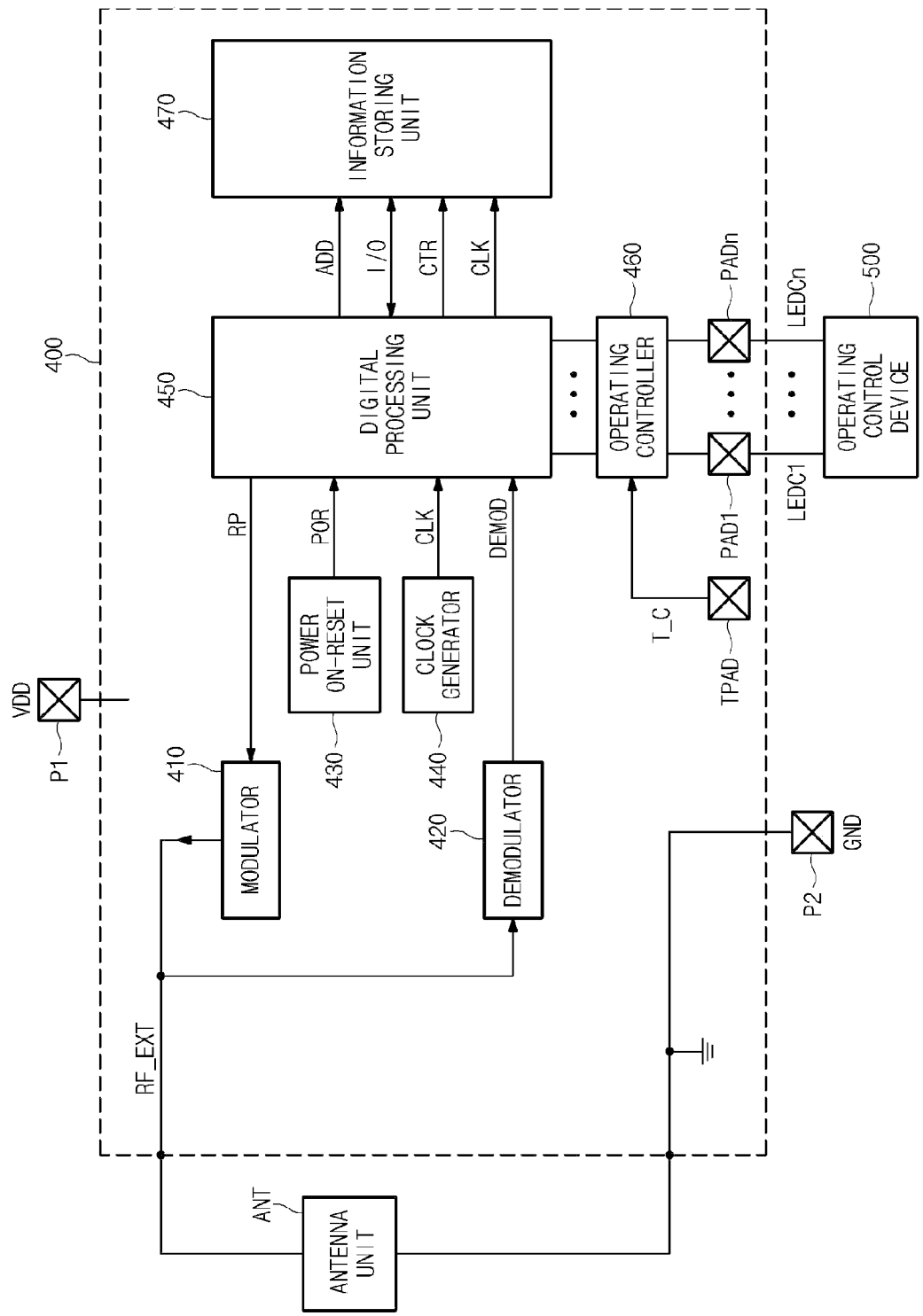
FIG. 5 is a block diagram showing a RFID chip according to another embodiment of the present invention.

FIG. 5 is a block diagram showing a RFID chip 400 included in a RFID package according to another embodiment of the present invention. The RFID chip 400 includes an antenna unit ANT, a modulator 410, a demodulator 420, a power-on-reset unit 430, a clock generator 440, a digital processing unit 450, an operating controller 460, an information storing unit 470, a plurality of pads PAD1 to PADn, and a temperature pad TPAD. Herein, the plurality of pads PAD1 to PADn is coupled to an external operation control device 500.

The antenna unit ANT receives a wireless signal RF_EXT transmitted from a RFID reader. The wireless signal RF_EXT inputted to the RFID chip 400 through the antenna unit ANT is inputted to the demodulator 420 through an antenna pad.

Further, the antenna unit ANT transmits a wireless signal received from the RFID chip 400 to an external RFID reader. A wireless signal delivered from the modulator 410 to the antenna unit ANT is transmitted to the external RFID reader through the antenna pad (not shown).

The demodulator 420 demodulates the wireless signal RF_EXT inputted through the antenna ANT to generate a command signal DEMOD and output the command signal DEMOD to the digital processing unit 450. The modulator 410 modulates a response signal RP inputted from the digital processing unit 450 to transmit a modulated signal to the antenna ANT.

The power-on-reset 430 senses the power voltage VDD inputted from a power voltage pad P1 and outputs a power-on-reset signal POR to the digital processing unit 450.

Herein, the power-on-reset signal POR for controlling a reset operation of internal circuits in the RFID chip 100 rises along with a transition from a low level to a high level of the power voltage VDD. The power-on-reset signal POR then changes from a high level to a low level after a predetermined time when the power voltage VDD is maintained at the high level to thereby reset an internal circuit of the RFID chip 400.

The clock generator 440 outputs a clock signal CLK to the digital processing unit 450. The clock signal CLK is for controlling an operation of the digital processing unit 450 according to the power voltage VDD delivered through the power voltage pad P1.

In the present embodiment, the RFID chip 400 is operated by a power voltage VDD and a ground voltage GND supplied through pads P1 and P2 respectively. In the conventional method when a RFID tag communicating with a RFID reader receives a wireless signal, the RFID tag can be supplied with a power voltage by an internal voltage amplifier.

However, in the present embodiment, because the RFID chip 400 is coupled to the external operation control device 500, a lot more power is needed. Thus, the present embodiment provides the power voltage VDD and the ground voltage GND to the RFID chip 400 via the pads P1 and P2.

Receiving the power voltage VDD, the power-on-reset signal POR, the clock signal CLK and the command signal DEMOD, the digital processing unit 450 decodes the command signal DEMOD to generate a control signal CTR and a plurality of process signals. Also, the digital processing unit 450 outputs the response signal RP corresponding to the control signal CTR and the plurality of process signals to the modulator 410. The digital processing unit 450 outputs an address ADD, an input/output data I/O, the control signal CTR, and the clock signal CLK to the information storing unit 470.

The operating controller 460 is located between the digital processing unit 450 and the plurality of pads PAD1 to PADn. According to an instruction signal inputted from the digital processing unit 450, the operating controller 460 outputs control signals for controlling operation of the external operation control device 500. The external operation control device 500 is coupled to the operating controller 460 of the RFID chip 400 via the plurality of pads PAD1 to PADn.

Herein, the plurality of pads PAD1 to PADn is coupled to the external operation control device 500 via connection pins, which serve as a connection block configured to couple the RFID chip 400 and the external operation control device 500. The control signals LEDC1 to LEDCn delivered via the plurality of pads PAD1 to PADn are outputted to the external operation control device 500.

The external operation control device includes a controller configured to control operations of display devices such as a LED, a motor, a speaker, and so on.

Further, the temperature pad TPAD included in the RFID chip 400 receives a temperature detection signal T_C inputted from the LED package. The temperature detection signal T_C inputted through the temperature pad TPAD is passed to the operating controller 460 of the RFID chip 400.

The operating controller 460 outputs the control signals LEDC1 to LEDCn to the external operation control device 500, wherein the control signals LEDC1 to LEDCn are used for controlling the amount of current which is applied to the LED package in response to the temperature detection signal T_C. Herein, the external operation control device 500 selectively delivers the control signal LEDC1 to LEDCn into the LED package to control on/off, intensity, brightness, etc. of the LED.

The information storing unit 470 includes a plurality of memory cells, each being able to store inputted data and output stored data.

The information storing unit 470 may include a nonvolatile ferroelectric memory. The data processing speed of Ferroelectric Random Access Memory (FeRAM) is typically similar to that of Dynamic Random Access Memory (DRAM). Further, the structure of FeRAM is similar to that of DRAM in that FeRAM includes a plurality of capacitors. However, the capacitors in a FeRAM device are made of a ferroelectric material having a high residual polarization, which in turn allows for data retention even when the power supplied to the memory device is terminated.

Figure 6:
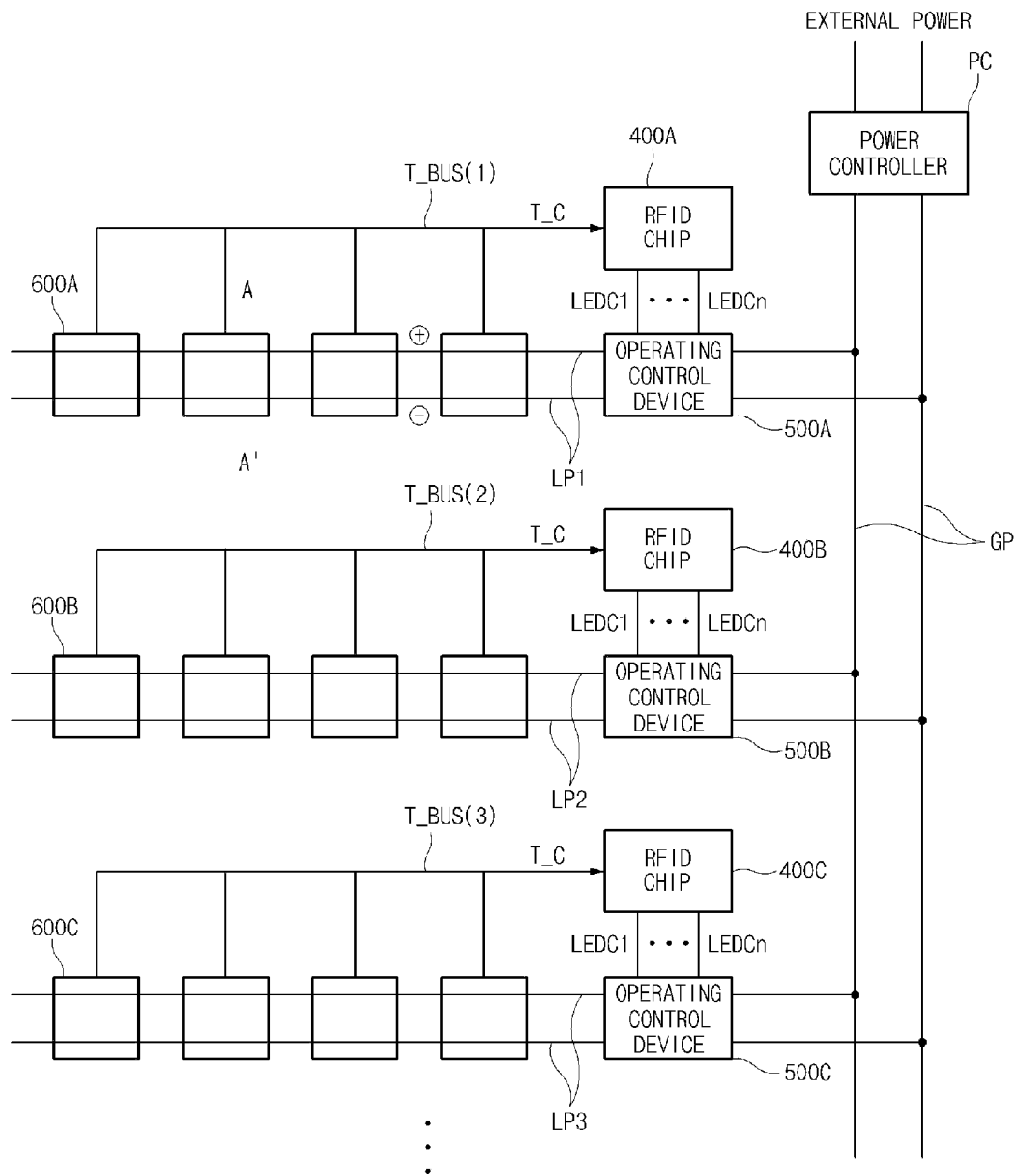
FIG. 6 is a block diagram showing a RFID system including a LED package according to another embodiment of the present invention.

FIG. 6 is a block diagram showing a RFID system including the RFID chip 400 shown in FIG. 5. As shown, the RFID system includes RFID chips 400A to 400C, operation control devices 500A to 500C, LED packages 600A to 600C, and a power controller PC. As used herein, the term "the RFID system" refers to an apparatus including all of the RFID chips 400A to 400C, the operation control devices 500A to 500C, the LED packages 600A to 600C, and the power controller PC.

The RFID chip 400A to 400C coupled to the operation control devices 500A to 500C outputs control signals LEDC1 to LEDCn to the operation control devices 500A to 500C. Herein, the operation control devices 500A to 500C deliver the control signals LEDC1 to LEDCn inputted from the RFID chip 400A to 400C into the LED package 600A to 600C. The operation control devices 500A to 500C can include switching devices (not shown).

The operation control devices 500A to 500C selectively supply power to the LED packages 600A to 600C through local power lines LP1 to LP3. Herein, the operation control devices 500A to 500C are controlled by the control signals LEDC1 to LEDCn inputted from the RFID chips 400A to 400C.

In addition, a plurality of LED packages 600A to 600C are controlled by the local power supplied through the local power lines LP1 to LP3. The LED packages 600A to 600C each coupled to the local power lines LP1 to LP3 are arranged in rows.

Further, the power controller PC is coupled to a global power line GP and supplies an external power to the global power line GP. The operation control devices 500A to 500C receive power from the power controller PC via the global power line GP. Herein, the voltage of the global power line GP is determined by the power controller PC.

The LED packages 600A to 600C including a temperature sensor outputs the temperature detection signal T_C generated by the temperature sensor to the temperature pad TPAD of the plurality of RFID chips 400A to 400C. The plurality of RFID chips 400A to 400C and the plurality of LED packages 600A to 600C are coupled through a plurality of bus T_BUS (1) to T_BUS(3). Each of the LED packages 600A to 600C sends temperature information measured by additional temperature sensors into the RFID chips 400A to 400C.

The RFID chips 400A to 400C adjusts the control signals LEDC1 to LEDCn in response to the temperature detection signal T_C inputted through the bus T_BUS(1) to T_BUS(3) to control the amount of current supplied to the LED packages 600A to 600C.

Figure 7:
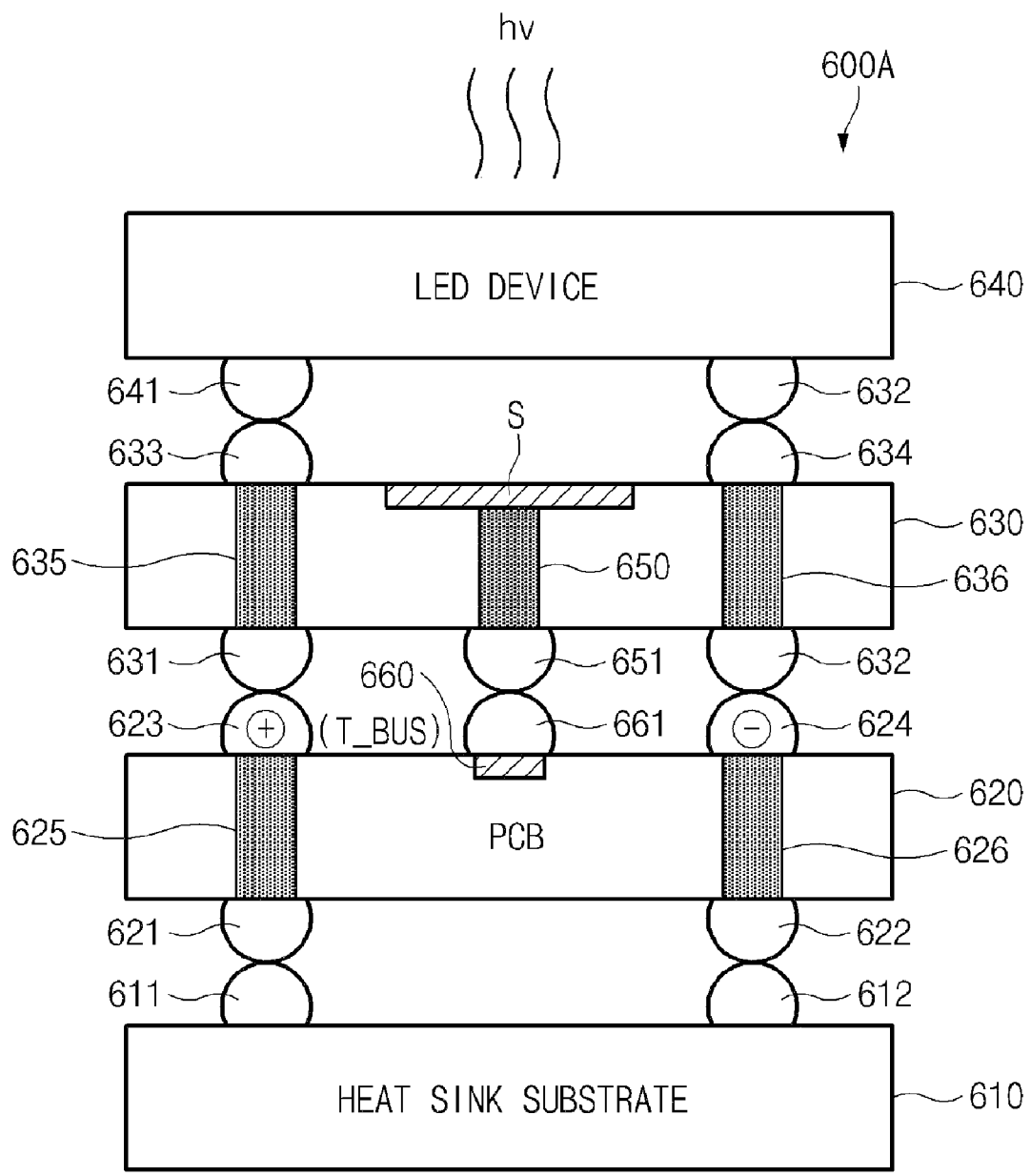
FIG. 7 is a block diagram depicting a cross section of the LED package shown in FIG. 6

FIG. 7 is a block diagram showing the LED packages 600A to 600C shown in FIG. 6. Particularly, FIG. 7 depicts a cross section of the LED package 600A along cut plane A-A' shown in FIG. 6

The LED package 600A includes a heat sink substrate 610, a printed circuit board (PCB) 620, an electrostatic discharge (ESD) device 630, and a LED device 640.

Herein, the heat sink substrate 610, the printed circuit board 620, the ESD device 630, and the LED device 640 are coupled to each other.

Heat sink electrodes 611 and 612 are formed in a shape of a bump (e.g., a partial sphere) over the heat sink substrate 610. Lower electrodes 621 and 622 are formed in a shape of a bump under the PCB 620. Herein, the lower electrodes 621 and 622 of the PCB 620 are electronically coupled to the heat sink electrodes 611 and 612 of the heat sink substrate 610. Over the PCB 620, upper electrodes 623 and 624 are formed in a shape of a bump.

Under the ESD device 630, lower electrodes 631 and 632 are formed in a shape of a bump. The lower electrodes 631 and 632 are electronically coupled to the upper electrodes 623 and 624. Over the ESD device 630, upper electrode 633 and 634 are formed in a shape of a bump.

Further, LED electrodes 641 and 642 are formed in a shape of a bump under the LED device 640. The LED electrodes 641 and 642 are electronically coupled to the upper electrodes 633 and 634.

In addition, the PCB 620 includes a power supply line and Through-Silicon Vias (TSVs) 625 and 626. The TSV 625 passes through the PCB 620. The upper electrode 623 is electronically coupled to the lower electrode 621 by the TSV 625. Likewise, the TSV 626 passes through the PCB 620. The upper electrode 624 is electronically coupled to the lower electrode 622 by the TSV 626.

The ESD device 630 includes an electrostatic discharge circuit and Through-Silicon Vias (TSVs) 635 and 636. The TSV 635 passes through the ESD device 630. The upper electrode 633 is electronically coupled to the lower electrode 631 by the TSV 635. Likewise, the TSV 636 passes through the ESD device 630. The upper electrode 634 is electronically coupled to the lower electrode 632 by the TSV 636.

The heat sink substrate 610, the PCB 620, the ESD device 630, and the LED device 640 are coupled to each other, and each are electronically connected through the TSVs 635, 636, 625, and 626.

The PCB 620 includes a signal transmission line 660. Herein, the signal transmission line 660 includes a bus T_BUS configured to deliver the temperature detection signal T_C from a temperature sensor S into the temperature pad TPAD of the RFID chip 400.

Herein, the signal transmission line 660 is formed in a shape of a trench over the PCB 620. Over the signal transmission line 660, the upper electrode 661 is formed in a shape of a bump.

The ESD device 630 includes the temperature sensor S and a Through-Silicon Via (TSV) 650. Herein, the temperature sensor S is coupled to the Through-Silicon Via (TSV) 650 passing through the ESD device 630.

Under the Through-Silicon Via (TSV) 650, a lower electrode 651 is formed in a shape of a bump. The lower electrode 651 is coupled to an upper electrode 661.

In the LED package 600A having a structure described above, if power is supplied through the local power line LP1, the LED device 640 emits light hv. Herein, power terminals of the LED device 340 are coupled to the LED electrodes 641 and 642 which is a conductive electrode.

When the LED device 640 emits light, the LED device 640 generates a lot of heat. This heat is conducted to the heat sink substrate 610 through the TSVs 635, 636, 625, and 626.

The TSVs 635 and 636 includes a material having a characteristic of high thermal conductivity to rapidly deliver the heat generated by the LED device 640 into the heat sink substrate 610. Further, the TSVs 635 and 636 includes a conductive material for supplying a power to the LED device 640.

In addition, the heat sink substrate 610 includes a heat sink substrate fan configured to remove the heat delivered from the LED device 640. The heat sink substrate 610 includes a material having a characteristic of high thermal conductivity in order to transfer heat generated by the LED device 640 into the surrounding air.

Figure 8:
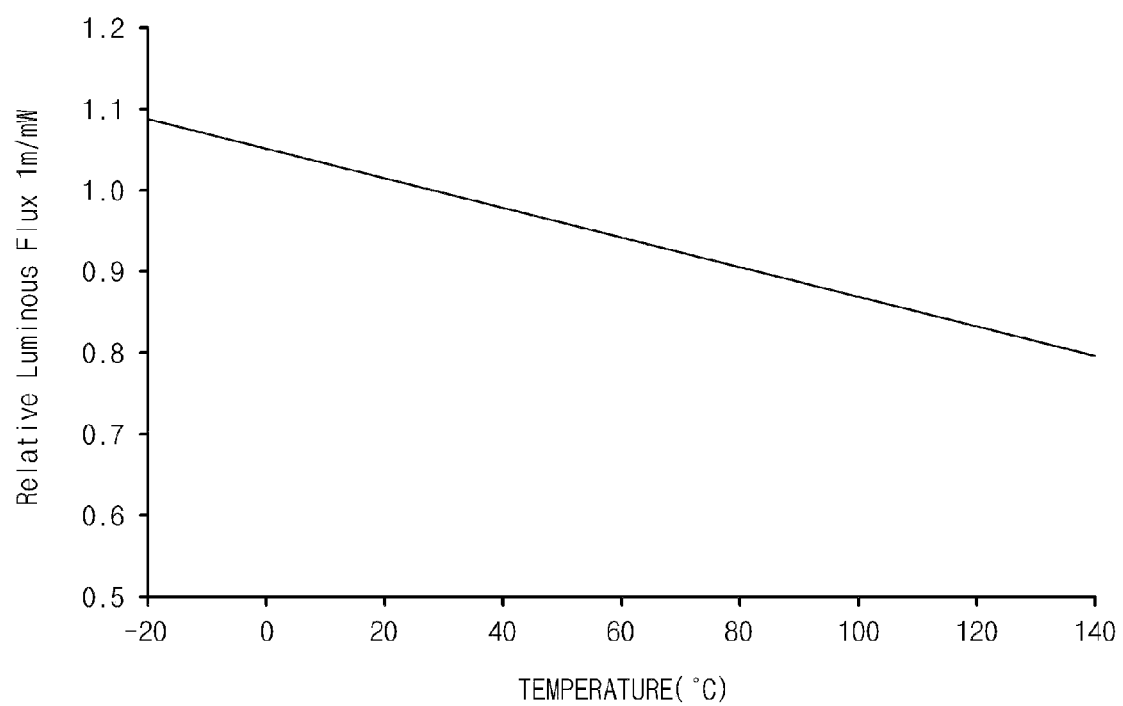
FIG. 8 is a graph describing a relative luminous flux of a LED device in response to temperature.

FIG. 8 is a graph describing a relative luminous flux of a LED device in response to temperature.

The temperature detection signal T_C sensed by the temperature sensor S of the LED package 600A is outputted to the temperature pad TPAD of the RFID chip 400 through the bus T_BUS. The operating controller 460 outputs the control signals LEDC1 to LEDCn in response to the temperature detection signal T_C in order to control the amount of current supplied into the LED package 600A.

As seen in FIG. 8, intensity of light emitted from the LED device 640 is decreased as temperature around the LED device 640 becomes higher. For example, in response to temperature increase of 100° C., intensity of light is decreased about 30%.

Figure 9:
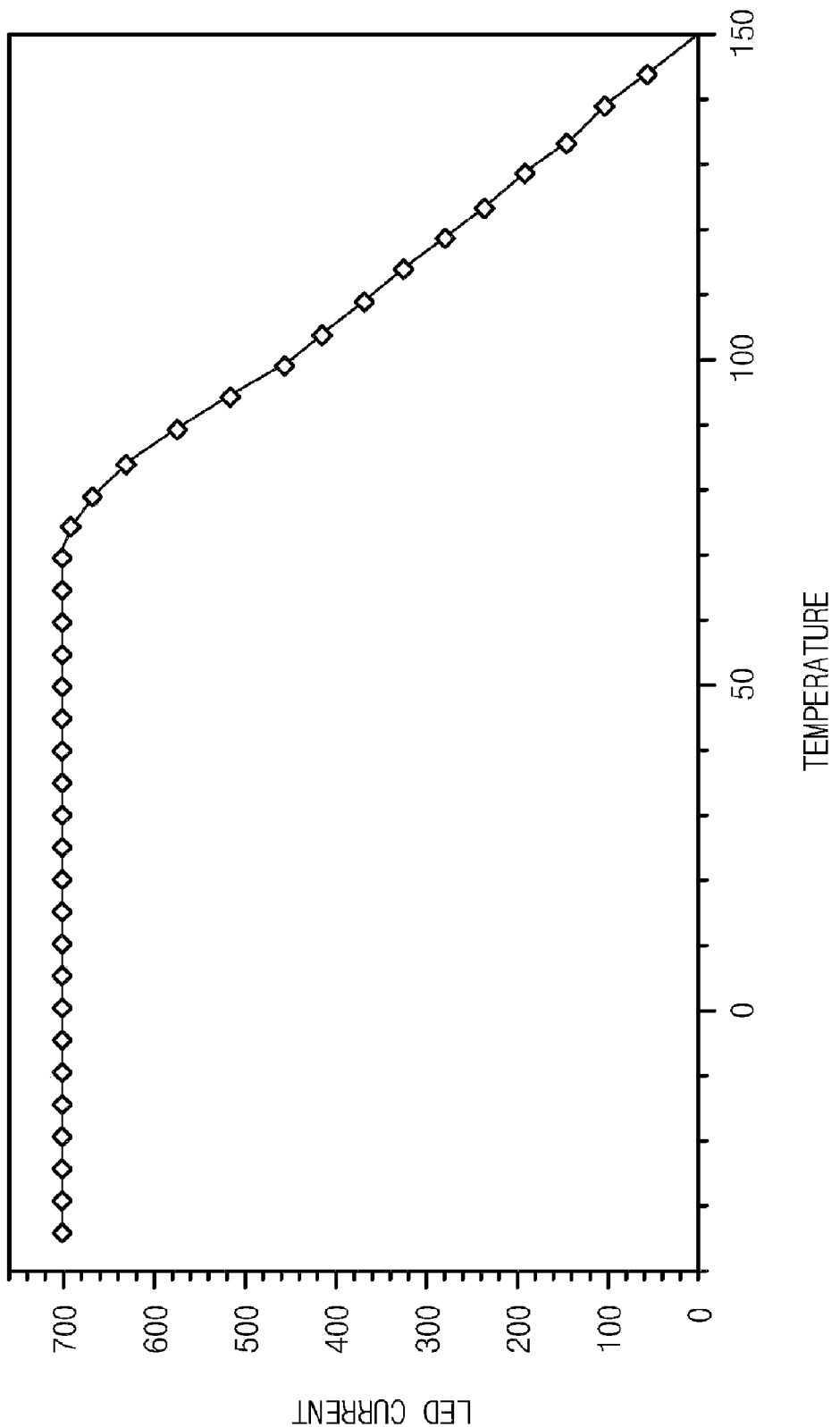
FIG. 9 is a graph describing current amount flowing through a LED device in response to temperature.

FIG. 9 is a graph describing current flowing through a LED device in response to temperature. Referring to FIG. 9, current flowing through the LED device 640 is constant until a temperature point (e.g., current falloff temperature) is reached where the current flowing through the LED device 640 is rapidly decreased.

Figure 10:
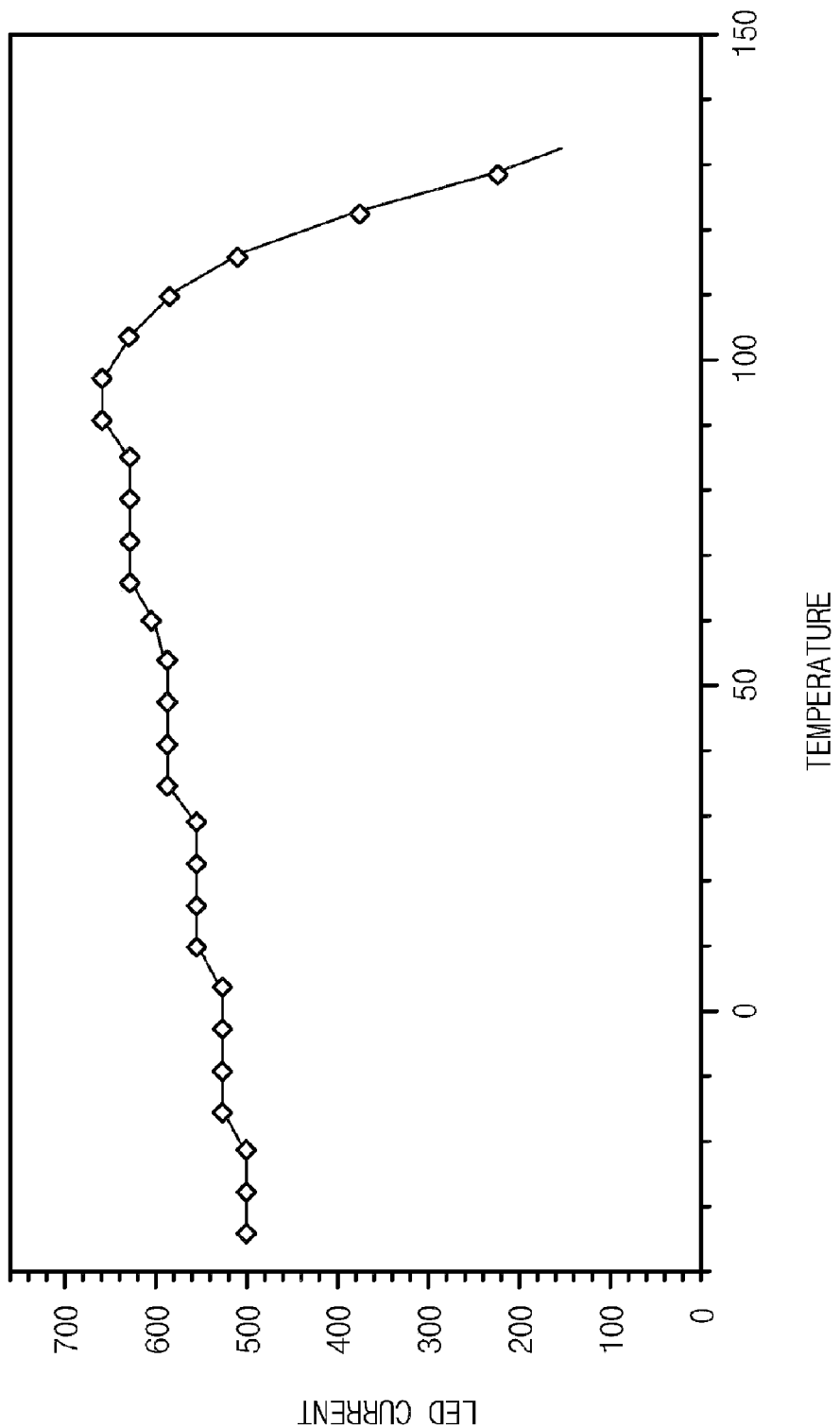
FIG. 10 is a graph describing current amount flowing through a LED device included in the LED package shown in FIG. 6 in response to temperature.

FIG. 10 is a graph describing current amount flowing through a LED device included in the LED package shown in FIG. 6 in response to temperature. As shown in FIG. 10, when a temperature around the temperature sensor S is increased, LED current is decreased which causes intensity of light emitted from the LED device to decrease.

Accordingly, before the temperature detection signal T_C reaches the current falloff temperature, the operating controller 460 may increase the amount of current supplied into the LED device 640 in order to compensate for the decrease in current flowing through the LED device 640.

However, if the operating controller 460 increases the amount of current supplied into the LED device 640 when the temperature detection signal T_C indicates a temperature over the current falloff temperature, the LED device 640 may be destroyed. Accordingly, if the temperature detection signal T_C indicates a temperature over the current falloff temperature, the operating controller 460 rapidly decreases the amount of current supplied into the LED device 640 in order to secure the LED device 640.

Recently, LED devices have been applied as a flood light used outside to light public or private buildings, sporting grounds, and other places at night. When a plurality of LED devices is turned on/off separately, various shapes or patterns can be shown. Further, according to user's request, location, and so on, the plurality of LED devices is controlled to adjust the intensity of light by controlling the amount of current flowing through the LED device.

In the present embodiment, a LED device can be controlled by an RFID system. That is, if a wireless signal is transferred by an external RFID reader after RFID tags is individually attached to the LED devices, the RFID tags recognize the wireless signal transmitted from the RFID reader and individually receive some comments according to unique ID information to thereby adjust or control on/off states and intensities of lights emitted from the LED devices coupled to the RFID tags.

Herein, since the RFID tag is cheaper than a general remote controller, manufacturing costs of the flood light can be decreased and convenience for controlling the flood light is increased when the RFID tag is applied as a flood light control.

In an embodiment of the present invention, a LED package includes a substrate and a display device, stacked on the substrate, including a light emitting diode (LED), and so on.

According to an embodiment of the present invention, a package includes a substrate using a through silicon via (TSV) having a high thermal conductivity so that efficiency of outputting relative luminous flux and efficiency of heat release generated by a display device attached to the substrate are improved.

A system according to an embodiment of the present invention includes a LED package coupled to a RFID chip configured to remotely control a display device included in the LED package.

In an embodiment of the present invention, a system includes a LED package including a temperature sensor, which is configured to control amount of current supplied into a LED device according to sensed temperature.

Although a number of illustrative embodiments consistent with the invention have been described, it should be understood that numerous other modifications and embodiments can be devised by those skilled in the art that will fall within the spirit and scope of the principles of this disclosure. More particularly, a number of variations and modifications are possible in the component parts and/or arrangements of the subject combinations arrangement within the scope of the disclosure, the drawings and the appended claims. In addition to variations and modifications in the component parts and/or arrangements, alternative uses will also be apparent to those skilled in the art.

What is claimed is:

1. A light emitting diode (LED) package, comprising:
   a LED device configured to emit light;
   an electrostatic discharge (ESD) device including an ESD circuit, the ESD device being provided below the LED device;
   a printed circuit board (PCB) including a power supply line, the PCB being provided below the ESD device; and
   a heat sink substrate provided below the PCB and configured to release heat received from the LED device through the ESD device and the PCB.

2. The LED package according to claim 1, wherein the ESD device comprises a first through silicon via (TSV) configured to transfer the heat received from the LED device to the PCB.

3. The LED package according to claim 2, wherein the first TSV comprises a conductive material extending vertically through the ESD device.

4. The LED package according to claim 1, wherein the PCB comprises a second through silicon via (TSV) configured to transfer the heat received from the ESD device to the heat sink substrate.

5. The LED package according to claim 4, wherein the second TSV comprises a conductive material extending vertically through the PCB.

6. The LED package according to claim 1, further comprising:
   a heat sink electrode formed on the heat sink substrate;
   a first lower electrode formed below the PCB and coupled to the heat sink electrode;
   a first upper electrode formed on the PCB;
   a second lower electrode formed below the ESD device and coupled to the first upper electrode;
   a second upper electrode formed over the ESD device; and
   a LED electrode formed below the LED device and coupled to the second upper electrode.

7. The LED package according to claim 1, further comprising: a temperature sensor configured to sense temperature around the LED device.

8. The LED package according to claim 7, wherein the temperature sensor is included in the ESD device.

9. The LED package according to claim 7, further comprising:
   a third TSV configured to transmit temperature information sensed by the temperature sensor to the PCB; and
   a third lower electrode formed under the third TSV.

10. The LED package according to claim 9, further comprising:
    a third upper electrode formed on the PCB and coupled to the third lower electrode; and
    a signal transmission line formed in the PCB and coupled to the third upper electrode.

11. A radio frequency identification (RFID) system, comprising:
    a plurality of LED packages, each LED package including a LED device;
    a RFID chip configured to read or write information in response to a wireless signal received through an antenna; and
    an operation controller configured to control operation of the plurality of LED packages in response to a control signal inputted from the RFID chip;
    wherein each of the plurality of LED packages comprises:
    a LED device configured to emit light;
    an ESD device including an ESD circuit provided below the LED device;
    a PCB including a power supply line and provided below the ESD device; and
    a heat sink substrate provided below the PCB and configured to release a heat received from the LED device through the ESD device and the PCB.

12. The RFID system according to claim 11, wherein the ESD device comprises a first TSV configured to remove the heat received from the LED device to the PCB.

13. The RFID system according to claim 12, wherein the first TSV comprises a conductive material extending vertically through the ESD device.

14. The RFID system according to claim 11, wherein the PCB comprises a second TSV configured to remove the heat received from the ESD device to the heat sink substrate.

15. The RFID system according to claim 14, wherein the second TSV comprises a conductive material extending vertically through the PCB.

16. The RFID system according to claim 11, each of the plurality of LED packages further comprises:
    a heat sink electrode formed on the heat sink substrate;
    a first lower electrode formed under the PCB and coupled to the heat sink electrode;
    a first upper electrode formed on the PCB;
    a second lower electrode formed below the ESD device and coupled to the first upper electrode;
    a second upper electrode formed over the ESD device; and
    a LED electrode formed below the LED device and coupled to the second upper electrode.

17. The RFID system according to claim 11, wherein the operation controller comprises a switching unit.

18. The RFID system according to claim 11, further comprising a local power line configured to supply power to the plurality of LED packages.

19. The RFID system according to claim 11, further comprising a power controller configured to supply an external power to the operation controller.

20. The RFID system according to claim 19, further comprising a global power line coupled between the power controller and the operation controller.

21. A radio frequency identification (RFID) system, comprising:
a plurality of LED packages, each LED package including a LED device;
a RFID chip configured to read or write information in response to a wireless signal received through an antenna; and
an operation controller configured to control operation of the plurality of LED packages in response to a control signal inputted from the RFID chip, wherein the RFID chip comprises:
a demodulator configured to demodulate the wireless signal to generate a command signal;
a processing unit configured to generate a control signal and a response signal according to the command signal;
a modulator configured to output the response signal in response to the command signal into an antenna;
a power-on-reset unit configured to generate a power-on-reset signal and output the power-on-reset signal to the processing unit;
a clock generator configured to generate a clock signal and output the clock signal to the processing unit; and
an information storing unit configured to read and write information in response to processing signals inputted from the processing unit,
wherein the information storing unit comprises a Ferroelectric Random Access Memory.

22. The RFID system according to claim 21, wherein the RFID chip further comprises:
a power voltage pad configured to supply a power voltage to the RFID chip; and
a ground voltage pad configured to supply a ground voltage to the RFID chip.

23. The RFID system according to claim 21, wherein the RFID chip further comprises:
a connection unit coupled to the operation controller; and
an operating control unit configured to output a driving signal for controlling operation of the operation controller into the connection unit.

24. The RFID system according to claim 23, wherein the connection unit comprises a pad coupled between the operation controller and the operating control unit.

25. A RFID system, comprising:
a plurality of LED packages configured to output a temperature detection signal sensed by a temperature sensor, each LED package including a LED device;
a RFID chip configured to read or write information in response to a wireless signal received through an antenna and output a control signal for controlling an amount of current supplied to the plurality of LED packages in response to the temperature detection signal; and
an operation controller configured to control operation of the plurality of LED packages in response to the control signal.

26. The RFID system according to claim 25, wherein the RFID chip is configured to gradually increase an amount of current supplied to the plurality of LED packages before the temperature detection signal is raised up to a predetermined temperature, and decrease an amount of current supplied to the plurality of LED packages when the temperature detection signal exceeds the predetermined temperature.

27. The RFID system according to claim 25, wherein each of the plurality of the LED packages comprises:
a LED device configured to emit light;
an ESD device including an ESD circuit, the ESD device being provided below the LED device;
a PCB including a power supply line and provided below the ESD device;
a heat sink substrate provided below the PCB and configured to release a heat delivered from the LED device through the ESD device and the PCB; and
a temperature sensor configured to sense temperature around the LED device.

28. The RFID system according to claim 27, wherein the temperature sensor is included in the ESD device.

29. The RFID system according to claim 27, further comprising:
a first TSV configured to transmit temperature information sensed by the temperature sensor to the PCB; and
a first lower electrode formed below the first TSV.

30. The RFID system according to claim 29, further comprising:
a first upper electrode formed on the PCB and coupled to the first lower electrode; and
a signal transmission line formed in the PCB and coupled to the first upper electrode.

31. The RFID system according to claim 27, wherein the ESD device comprises a second TSV configured to remove the heat received from the LED device to the PCB.

32. The RFID system according to claim 31, wherein the second TSV comprises a conductive material extending vertically through the ESD device.

33. The RFID system according to claim 27, wherein the PCB comprises a third TSV configured to transfer the heat received from the ESD device to the heat sink substrate.

34. The RFID system according to claim 33, wherein the third TSV comprises a conductive material extending vertically through the PCB.

35. The RFID system according to claim 27, further comprising:
a heat sink electrode formed on the heat sink substrate;
a second lower electrode formed below the PCB and coupled to the heat sink electrode;
a second upper electrode formed on the PCB;
a third lower electrode formed below the ESD device and coupled to the second upper electrode;
a third upper electrode formed over the ESD device; and
a LED electrode formed below the LED device and coupled to the third upper electrode.

36. The RFID system according to claim 25, further comprising a local power line configured to supply power to the plurality of LED packages.

37. The RFID system according to claim 25, further comprising a power controller configured to supply an external power to the operation controller.

38. The RFID system according to claim 37, further comprising a global power line coupled between the power controller and the operation controller.

39. The RFID system according to claim 25, wherein the RFID chip comprises:
a demodulator configured to demodulate the wireless signal to generate a command signal;

a processing unit configured to generate a control signal and a response signal according to the command signal;

a modulator configured to output the response signal in response to the command signal into an antenna;

a power-on-reset unit configured to generate a power-on-reset signal and output the power-on-reset signal to the processing unit;

a clock generator configured to generate a clock signal and output the clock signal to the processing unit; and an information storing unit configured to read and write information in response to processing signals inputted from the processing unit, wherein the information storing unit comprises a Ferroelectric Random Access Memory.

40. The RFID system according to claim 25, wherein the RFID chip further comprises:

a power voltage pad configured to supply a power voltage to the RFID chip; and a ground voltage pad configured to supply a ground voltage to the RFID chip.

41. The RFID system according to claim 25, wherein the RFID chip further comprises:

a connection unit coupled to the operation controller; and an operating control unit configured to output a driving signal for controlling operation of the operation controller into the connection unit.

42. The RFID system according to claim 41, wherein the connection unit comprises a pad coupled between the operation controller and the operating control unit.

43. The RFID system according to claim 25, further comprising a bus configured to deliver the temperature detection signal inputted from the plurality of LED packages into the RFID chip.

* * * * *